United States Patent [19]

Wojnarowski et al.

[11] Patent Number: 5,546,654
[45] Date of Patent: Aug. 20, 1996

[54] VACUUM FIXTURE AND METHOD FOR FABRICATING ELECTRONIC ASSEMBLIES

[75] Inventors: Robert J. Wojnarowski, Ballston Lake; Thomas B. Gorczyca, Schnectady, both of N.Y.

[73] Assignee: General Electric Company, Schenectady, N.Y.

[21] Appl. No.: 297,076

[22] Filed: Aug. 29, 1994

[51] Int. Cl.$^6$ .............................. H05K 3/30; H05K 3/42; B23P 19/04
[52] U.S. Cl. ................... 29/841; 29/743; 29/852; 29/DIG. 44; 279/3
[58] Field of Search ............... 29/743, 841, 852, 29/855, 856, DIG. 44, 848; 279/3; 264/272.13–272.15; 414/737

[56] References Cited

U.S. PATENT DOCUMENTS

| | | | |
|---|---|---|---|
| 3,004,766 | 10/1961 | Bryant | 279/3 |
| 4,778,326 | 10/1988 | Althouse et al. | 29/743 X |
| 4,783,695 | 11/1988 | Eichelberger et al. | 257/723 X |
| 4,880,349 | 11/1989 | Woodward | 29/743 X |
| 4,893,403 | 1/1990 | Heflinger et al. | 29/840 |
| 4,906,011 | 3/1990 | Hiyamizu et al. | 279/3 |
| 4,953,287 | 9/1990 | West et al. | 29/743 X |
| 5,091,769 | 2/1992 | Eichelberger | 257/723 X |
| 5,249,343 | 10/1993 | Grosso et al. | 29/743 X |

FOREIGN PATENT DOCUMENTS

| | | | |
|---|---|---|---|
| 1300599 | 12/1989 | Japan | 29/743 |
| 414848 | 1/1992 | Japan | 279/3 |
| 4216649 | 8/1992 | Japan | 279/3 |
| 1045017 | 10/1966 | United Kingdom | 279/3 |

OTHER PUBLICATIONS

IBM Technical Disclosure Bulletin, vol. 6, No. 7, Dec. 1963, p. 61.

Primary Examiner—Peter Vo
Attorney, Agent, or Firm—Ann M. Agosti; Marvin Snyder

[57] ABSTRACT

A method for fabricating an electronic assembly comprises attaching an insulative film to a frame and positioning at least one electronic component having a face with connections pads face down on the insulative film. The insulative film is positioned on a porous sheet supported by a vacuum fixture. The porous sheet and vacuum fixture are adapted so as to be capable of creating vacuum conditions for holding the insulative film with a substantially flat surface on the porous sheet. A vacuum is created within the vacuum chamber for flatly holding the insulative film on the porous sheet. A substrate is applied to the insulative film and the at least one electronic component. In one embodiment the substrate is applied by securing the insulative film in position with a mold form having at least one opening around the electronic component and adding substrate molding material at least partially around the component through the opening. In another embodiment the substrate is applied by providing a substrate having at least one well therein and positioning the insulative film over at least a portion of the substrate and the electronic component into the well.

23 Claims, 7 Drawing Sheets

VACUUM FIXTURE AND METHOD FOR FABRICATING ELECTRONIC ASSEMBLIES

This invention was made with Government support under Government Contract No. F29601-89-C-0014 awarded by the Air Force. The Government has certain rights in this invention.

BACKGROUND OF THE INVENTION

1. Field of the Invention

This invention relates generally to fabrication of planar surfaces for integrated circuits and, more particularly, to a high density interconnect (HDI) fixture and process for fabricating HDI circuits with planar surfaces.

2. Description of the Related Art

Conventional high density interconnect (HDI) processes often use cavities formed into a substrate base for the placement of chips so that the top surfaces of the chips are essentially planar with the surface of the substrate. The substrate is generally a ceramic or a composite structure. The conventional HDI technique for fabricating cavities in the substrate is to mechanically machine or mill out the cavity material with a computer-controlled diamond tooled bit. This time consuming process does not always provide the desired chip cavity depth and can result in cracks which render the substrate unusable, and chips placed with this process often are displaced during further processing because there are non-uniform surface tension forces at the chip-to-die attach adhesive inter-face.

In conventional HDI techniques, an adhesive-coated polymer film overlay covers a plurality of integrated circuit chips in chip wells on an underlying substrate. The polymer film provides an insulated layer upon which is deposited a metallization pattern for interconnection of individual circuit chips. Methods for performing a HDI process using overlays are described in Eichelberger et al., U.S. Pat. No. 4,783,695, issued Nov. 8, 1988, and in Eichelberger et al., U.S. Pat. No. 4,933,042, issued Jun. 12, 1990. Additionally, it is desirable to provide via openings or apertures in the polymer film overlay so as to be able to provide electrical connection between various parts of a chip or between several chips. Eichelberger et al., U.S. Pat. No. 4,894,115, issued Jan. 16, 1990, describes embodiments for providing such apertures.

Fillion et al., "Embedded Substrate For Integrated Circuit Modules," Ser. No. 08/087,434, filed Jul. 9, 1993, which is a continuation-in-part of application Ser. No. 08/014,481, filed Feb. 8, 1993, and is herein incorporated by reference, describes a method of fabricating an HDI substrate by molding plastic around chips placed on a film, thus eliminating the milling process and providing a planar surface without moats between chips and the substrate. Briefly, the technique includes applying an insulative base sheet over a base. At least one chip having contact pads is placed face down on the base sheet. A mold form is positioned around a desired perimeter and surrounds at least one chip. Substrate molding material is added and then hardened within the mold form. Then the mold form and base are removed, the substrate is inverted, and the chips are interconnected. Removal of the mold form can be facilitated if a release agent, such as Teflon polytetrafluoroethylene or vegetable oil, has been applied to the mold form prior to the addition of the substrate molding material. It can be difficult to obtain a planar base sheet surface because, as the molding material cures and/or cools, the base sheet can be lifted off the base and wrinkled.

Flat, void-free laminations of different types of materials such as epoxy and polyimides are thus not easy to achieve when the materials must withstand the environmental stresses of electronic fabrication. Furthermore, in conventional patterning techniques of multi-layer modules, solvent crazing of polymer films or poor adhesion of subsequent layers occurs due to dissolved solvents or residues of mold release agents present in the preceding layers.

SUMMARY OF THE INVENTION

Accordingly, an object of the invention is to provide a method for fabricating a void-free and wrinkle-free surface for an integrated circuit. The object is achieved by applying an incremental vacuum force to a film surface to restrain the film in a proper position while applying the substrate to the film surface.

Briefly, in accordance with a preferred embodiment of the invention, a method for fabricating an electronic assembly comprises attaching an insulative film to a frame and positioning at least one electronic component having a face with connections pads face down on the insulative film. The insulative film is positioned on a porous sheet supported by a vacuum fixture. The porous sheet and vacuum fixture are adapted so as to be capable of creating vacuum conditions for holding the insulative film with a substantially flat surface on the porous sheet. A vacuum is created within the vacuum chamber for flatly holding the insulative film on the porous sheet, and a substrate is applied to the insulative film and to the at least one electronic component.

In accordance with another preferred embodiment of the invention, a method for fabricating an electronic assembly comprises attaching an insulative film to a frame and positioning the insulative film on a porous sheet supported by a vacuum fixture. The porous sheet and vacuum fixture are adapted so as to be capable of creating vacuum conditions for holding the insulative film with a substantially flat surface on the porous sheet. At least one electronic component having a face with connections pads is positioned face up in a well of a substrate. A vacuum is created with the vacuum chamber for flatly holding the insulative film on the porous sheet, and the insulative film is applied on the at least one electronic component and at least a portion of the substrate while maintaining the vacuum.

In accordance with another preferred embodiment of the invention, an apparatus for fabricating an electronic assembly comprises a porous sheet and a vacuum fixture supporting the porous sheet. The porous sheet and vacuum fixture are capable of creating vacuum conditions for holding an insulative film with a substantially flat surface on the porous sheet.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
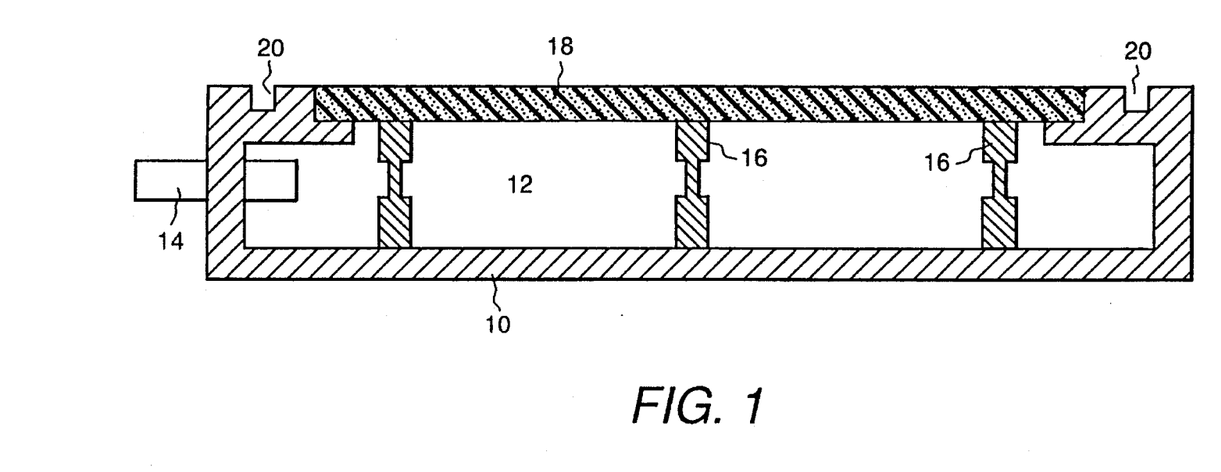
FIG. 1 is a sectional side view of a vacuum fixture of the present invention.

FIG. 1 is a sectional side view of a vacuum fixture 10 of the present invention. Fixture 10 supports a porous sheet 18 and creates a chamber 12 having incremental support posts 16 to provide the porous sheet with a flat surface during the molding of a substrate, as discussed below. Vacuum conditions are achieved through a vacuum port 14.

Vacuum fixture 10 may comprise any suitable structural material capable of supporting vacuum conditions. The vacuum fixture material should be resistant to rust, have a coefficient of thermal expansion (CTE) similar to the CTE of porous sheet 18, and be structurally stable over the temperature range of the fabrication process. For example, the vacuum fixture may comprise stainless steel, plated structural steel, Inconel metal alloy (Inconel is a trademark of International Nickel Co. Inc. for a metal alloy including 76 Ni, 15 Cr, and 9% Fe), or other nickel-based metal alloys. Notches 20 are provided in one embodiment for ease in further fabrication steps.

Porous sheet 18 comprises a sponge-like material having pores. The porous sheet is capable of allowing a vacuum force to be applied to hold an insulative film (shown in FIG. 2) flatly on the surface and capable of withstanding the stresses resulting from the substrate molding process. In one embodiment, the porous sheet comprises a microscopically porous stainless steel material that allows vacuum force to be applied to the film without wrinkling or deforming the film's top surface and thus provides a flat surface on which to fabricate the high density interconnections. Another appropriate material for the porous sheet is Inconel metal alloy which is advantageous because it has a lower CTE (2–7) than the CTE of stainless steel (11–12) and because it can be more resistant to rust. Other materials which can be used in a porous sheet include, for example, Monel metal alloys (Monel is a trademark of International Nickel Co. Inc. for a metal alloy including 67 Ni, 28 CU, 1–2 Mn, and 1.9%–2.5% Fe), nickel, and high nickel molybdenum alloys. PALL Porous Metals Filter Corp., of Cortland, N.Y., fabricates one type of porous sheet, under the designation PSS, which has been found to be useful. Although the pores may comprise small holes extending directly through the porous sheet, preferably the pores have a sponge-like formation to reduce irregularities on the surface. The smallest pore size that can still allow the vacuum conditions to hold a film on the porous sheet is preferred.

Incremental support posts 16 are not necessarily required, but are useful for holding the porous sheet in a flat position. In a preferred embodiment the support posts comprise a structural material substantially similar to the vacuum fixture so that any vertical expansion of the posts does not create irregularities in the porous sheet.

Figure 2:
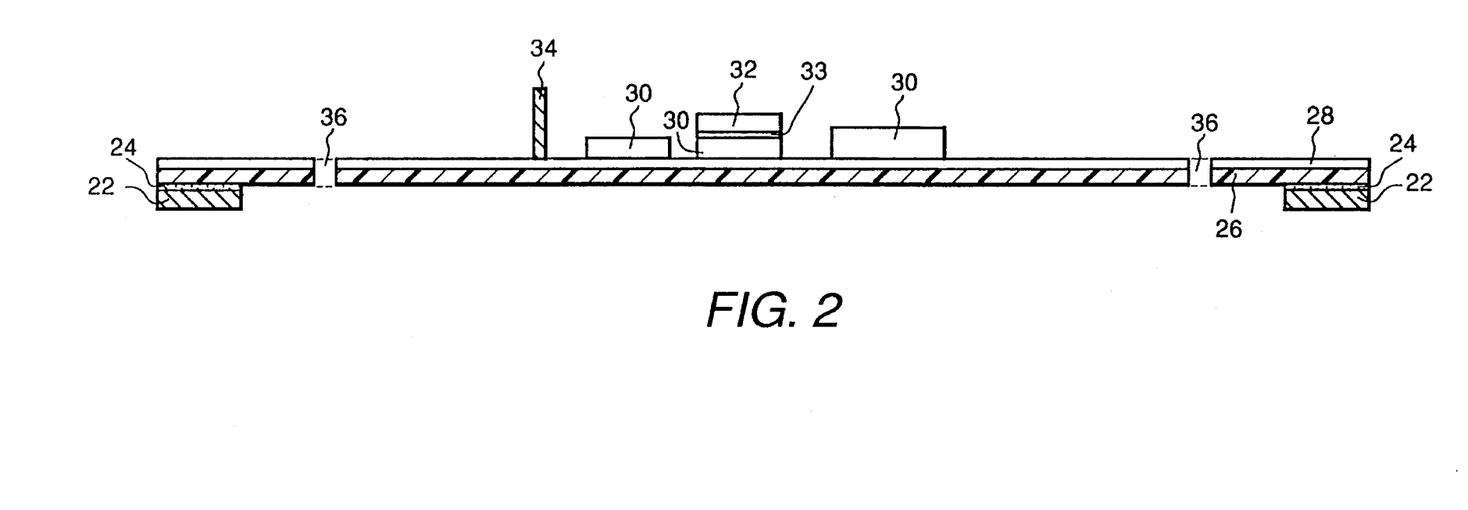
FIG. 2 is a sectional side view of an insulative film bonded to a frame and supporting a plurality of electronic components.

FIG. 2 is a sectional side view of an insulative film 26 bonded to a frame 22 and supporting a plurality of electronic components 30. The frame has an area greater than that of the substrate to be molded and in one embodiment the area is greater than that of the vacuum fixture. The frame can have any shape over which the film can be stretched and bonded, and the frame may comprise a material such as stainless steel, Inconel metal alloy, or titanium, for example.

Insulative film 26 preferably comprises a material which will be useful as a first layer through which electrical interconnections can be made on the finished substrate. The film may comprise a material which, during processing, does not melt and is dimensionally stable. In one embodiment film 26 comprises Kapton polyimide which is stretched and bonded to frame 22 with an adhesive 24 such as Ultem polyetherimide resin (Ultem is a registered trademark of General Electric Company, Pittsfield, Mass.). The film preferably has a thickness ranging from 1 mil to 2 mils. Polyimides are useful because they are typically laser ablatable at wavelengths compatible with HDI processing. Other examples of materials appropriate for insulative film 26 include Ultem polyetherimide 5000, Mylar polyethylene terephthalate (Mylar is a trademark of E. I. dupont de Nemours and Co.), Upilex polyimide (Upilex is a trademark of UBE Industries, Ltd.) and polyetherketone resins.

A layer of adhesive, shown as epoxy layer 28, is used in one embodiment for holding electronic components in position on film 26. An epoxy or other thermosetting material is preferred for the layer of adhesive because, after its initial curing, it will not redissolve during further fabrication steps.

Adhesion of epoxy to untreated Kapton polyimide is not easily accomplished, so, in a preferred embodiment, the film is subjected to a RIE (reactive ion etching) technique in $O_2$ to promote adhesion of epoxy layer 28. In one embodiment, epoxy layer 28 comprises about 15 μm of SPI(siloxane-polyimide)/epoxy material which is partially cured for about two hours at a temperature of 100° C. Adhesion between the SPO/epoxy and the electronic component can be improved by applying a coupling agent, such as, for example, VM651 polyimide manufactured by E. I. du Pont de Nemours & Co., over the components prior to their application to the epoxy layer.

Electronic components 30 such as semiconductor chips and parts including, for example, resistors, inductors, crystals, and other micro-assemblies can be positioned on the epoxy layer by hand or with a pick-and-place machine. Other elements which can be positioned on the epoxy layer include, for example, feedthrough pins or leads 34, as well as torroid transformers. Heat sinking assemblies 32 can be positioned with adhesive 33 on selected electronic components, if desired.

In one embodiment, the positioning of the electronic components with component pads on face surfaces is accomplished by treating the components with a coupling agent and placing them face-down on the epoxy layer at a temperature of about 80° C. At this temperature, the epoxy has a surface which is soft and viscous. Thus when the components are positioned they are recessed into the softened epoxy layer and held securely. Interconnections can be later made to the component pads by forming vias through the insulative film and the epoxy layer. If the epoxy used does not absorb strongly at the laser frequency used for forming vias in the insulative film, then minimizing the epoxy thickness over the component pads by pushing the contact pads through the bulk of the epoxy to the insulative film will facilitate formation of vias.

Epoxy layer 28 is useful for holding the electronic components in position. If an epoxy layer is not desired, another fabrication option is to place some adhesive on each component before positioning the components.

In one embodiment, openings 36 can be formed through film 26 and epoxy layer 28 prior to placement of the film on the vacuum fixture. The prefabrication of these openings is not necessary, however, because, as described below, when screws are inserted through a clamping plate the screws can poke through the film and epoxy layer at that time. Furthermore, if the clamping plate is held in position by other means, screws and fixture notches 20 need not be used.

Figure 3:
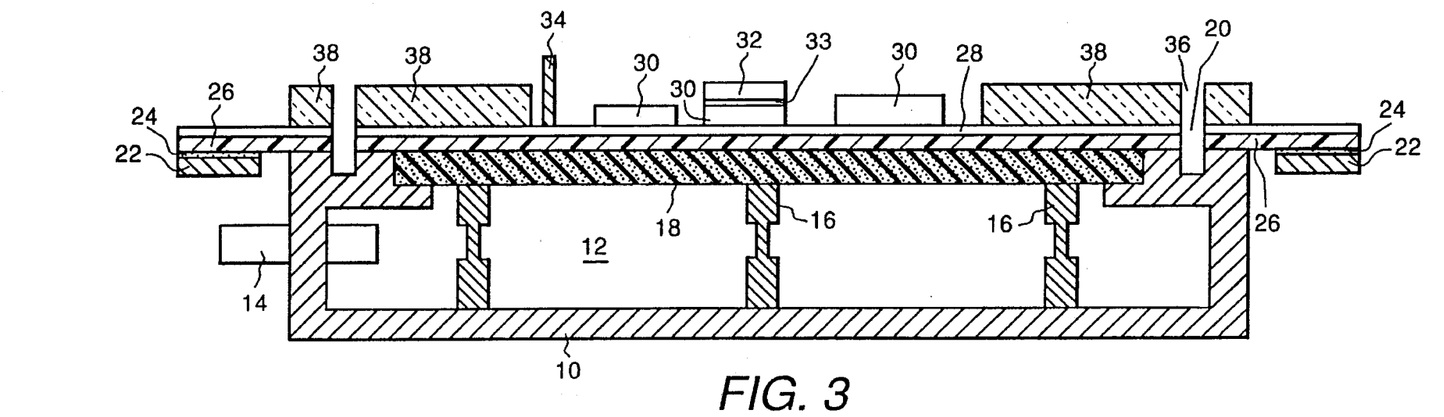
FIG. 3 is a sectional side view of the film of FIG. 2 positioned on the vacuum fixture of FIG. 1.

FIG. 3 is a sectional side view of insulative film 26 of FIG. 2 positioned in vacuum fixture 10 of FIG. 1. First, frame 22 is positioned on porous sheet 18 of vacuum fixture 10. Then vacuum conditions are applied so that the film is securely held evenly through the pores of the porous sheet. Preferably the surface area of the porous sheet is greater than the surface area of the substrate to be fabricated.

A mold form having at least one opening is applied over a portion of the fixture (preferably after the vacuum has been applied) with the opening leaving the components exposed. The mold form can have a number of different embodiments.

In the embodiment of FIG. 3, a first part of the mold form, shown as nonadhering insert 38, is applied over a portion of the fixture. Insert 38 preferably does not adhere to the film, epoxy, or the molding material designed to be added, and the insert has a thickness which is greater than the thickness of the substrate to be molded. In one embodiment, the insert comprises Teflon (FEP) polytetrafluoroethylene (Teflon is a trademark of E. I. du Pont de Nemours & Co.). If screws are to be used, the insert preferably has prefabricated openings 39 for alignment with vacuum frame notches 20.

Figure 4:
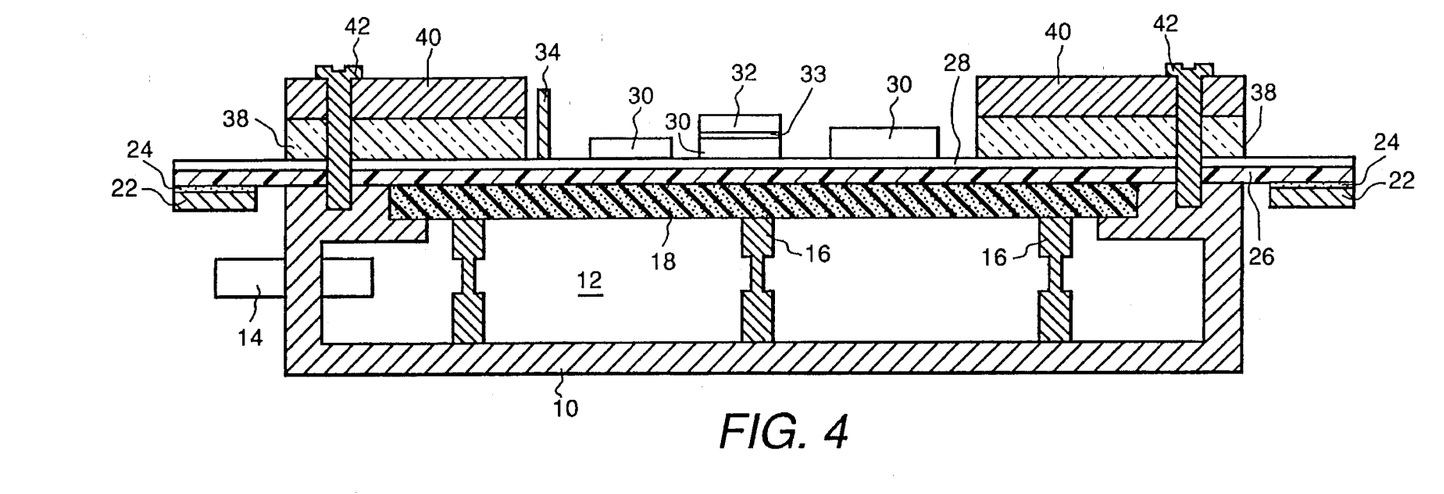
FIG. 4 is a view similar to that of FIG. 3, further showing a mold form and screws for holding the film in position.

FIG. 4 is a view similar to that of FIG. 3, further showing a clamping plate 40, which forms the second portion of the mold from, and screws 42 for holding insulative film 26 in position. The clamping plate may comprise any suitable material which can hold the insert and film in position and withstand the substrate fabrication temperatures. In one embodiment, the clamping plate comprises material similar to the material of vacuum fixture 10. The screws are inserted though the clamping plate, insert, epoxy, and film into notches 20 of vacuum fixture 10 and tightened so as to hold the insert flat and to hold the stretched film tightly.

Different sizes and shapes of substrates can be obtained by selecting among various inserts and clamping plates which can be used with a single vacuum fixture. Thus, the fabrication technique can easily accommodate customized design needs.

The use of screws for securing the clamping plate is for purposes of example only. Other appropriate techniques can be used, such as, for example, a C-clamp (not shown).

Figure 5A:
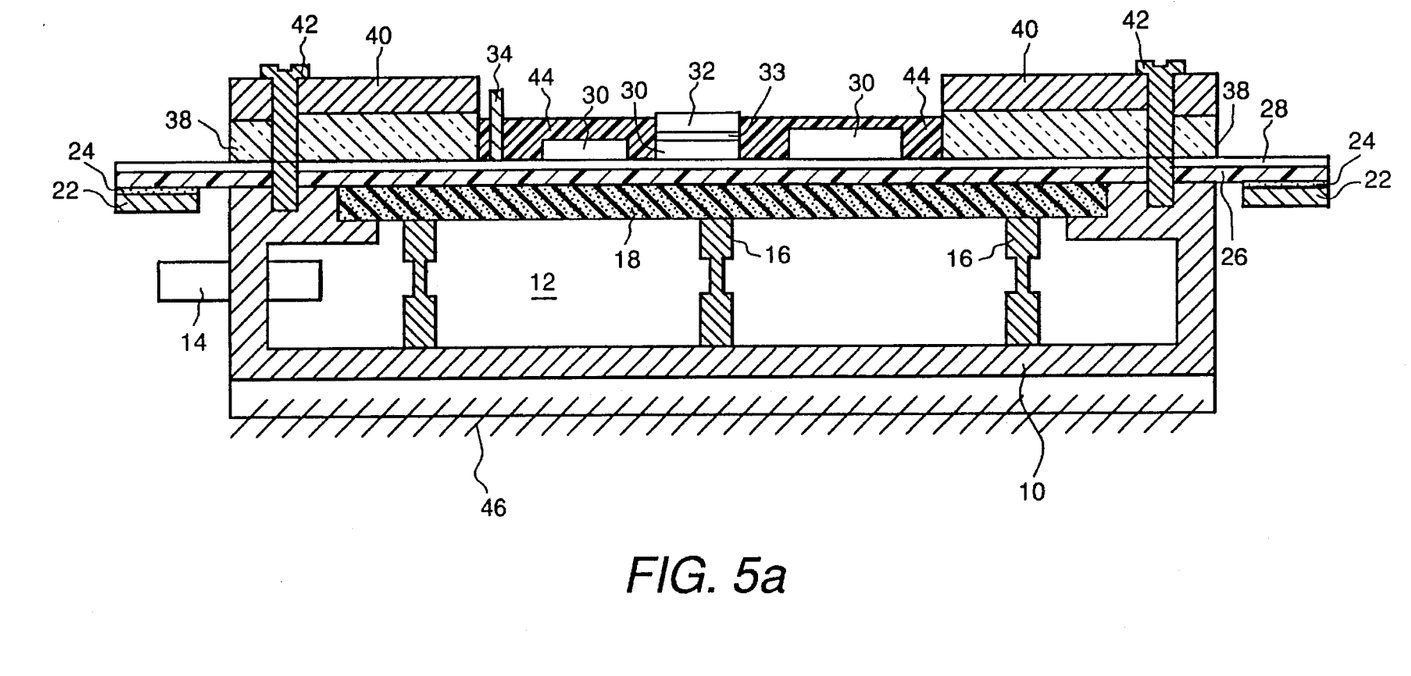
FIG. 5a is view similar to that of FIG. 4, further showing molding material around the electronic components.

FIG. 5a is a view similar to that of FIG. 4, further showing molding material 44 around the electronic components. As discussed in aforementioned Fillion et al., Ser. No. 08/087,434, potential substrate molding materials include, but are not limited to, aliphatic and aromatic polymers including thermoplastic and thermoset type polymers and blends of various polymers such as Ultem polyetherimide resin, acrylates, polyurethanes, polytetrafluoroethylenes, epoxies, benzocyclobutene (BCB), polyimides, or other polymers. One important consideration when selecting a molding material is that it must be able to withstand subsequent processing steps and the end usage environment. Other considerations and enhancements such as the use of filler material are also discussed in the aforementioned Fillion et al., Ser. No. 08/087,434. In one embodiment the molding material is Dexter Hysol FP 4450 filled cycloalaphatic epoxy material obtainable from Dexter Electronic Materials Division of Dexter Corp., Industry, Calif. In another embodiment, the molding material comprises Bacon Industries stock number P182 epoxy available from Bacon Industries, Watertown, Mass., combined with a polyamine curing agent, Activator BA-182, also available from Bacon Industries. In a preferred embodiment, a similar type of material is used for the molding material and the epoxy layer 28 such that the molding material and the epoxy cross-link.

Hardening of the substrate molding material can be accomplished in any appropriate manner, including, for example, heating, evaporation, and curing.

In one embodiment, a ramped hot plate can be used to profile the curing cycle of the molding material to prevent potential bubbles from forming in the molding material. The ramping of the hot plate is preferably from a temperature of 80° C. to a temperature of 250° C., which actually heats the molding material from a temperature of 50° C., to a temperature of about 170° C. This peak temperature can be held for about two hours.

Figure 5B:
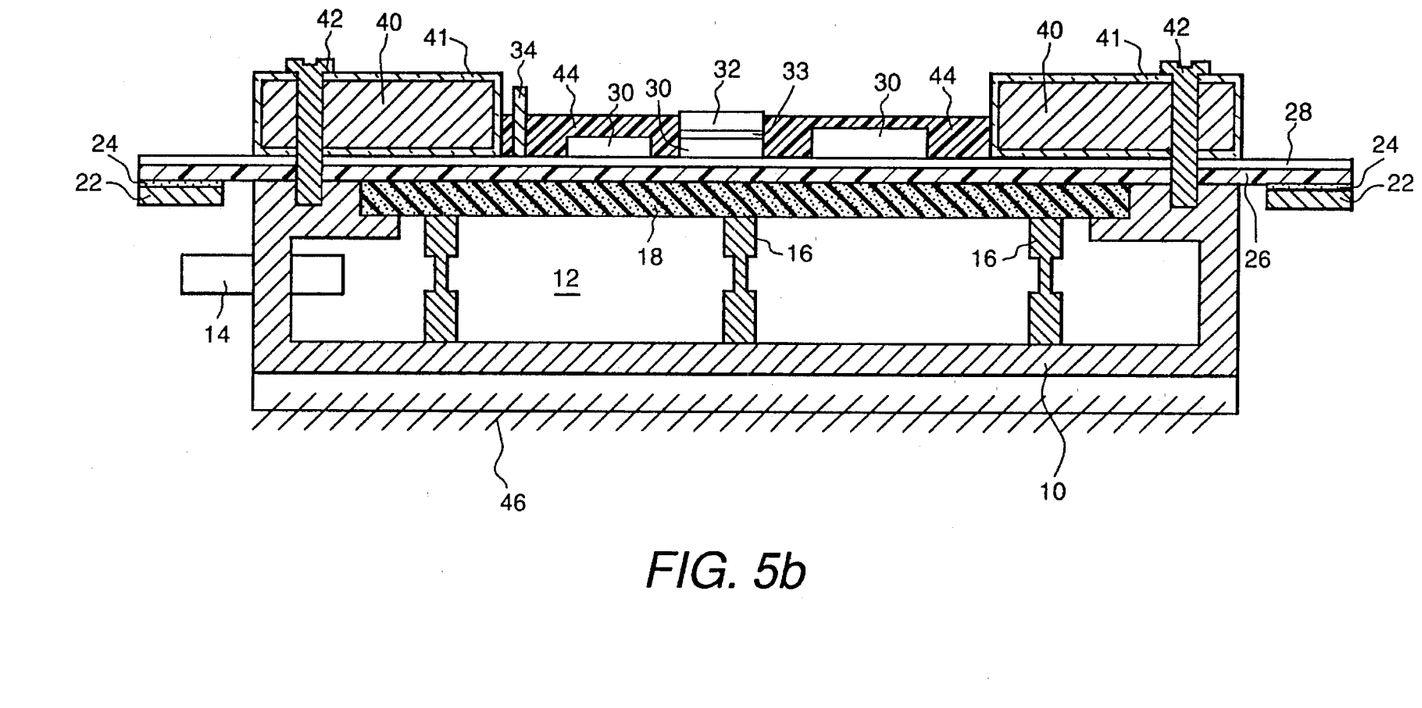
FIG. 5b is a view similar to that of FIG. 5a, showing a different embodiment of the mold form.

FIG. 5b is a view similar to that of FIG. 5a, showing a different embodiment of mold form 40. In this embodiment, the insert 38 (shown in FIG. 4) is not present. Instead, the mold form is at least partially coated with a coating 41 which does not adhere to molding material 44 or film 26. In one embodiment the coating comprises powder-coated polytetrafluoroethylene.

In a similar embodiment, the mold form itself comprises a substantially solid plate of material which does not adhere to the substrate molding material. In this embodiment, no coating is necessary.

Figure 5C:
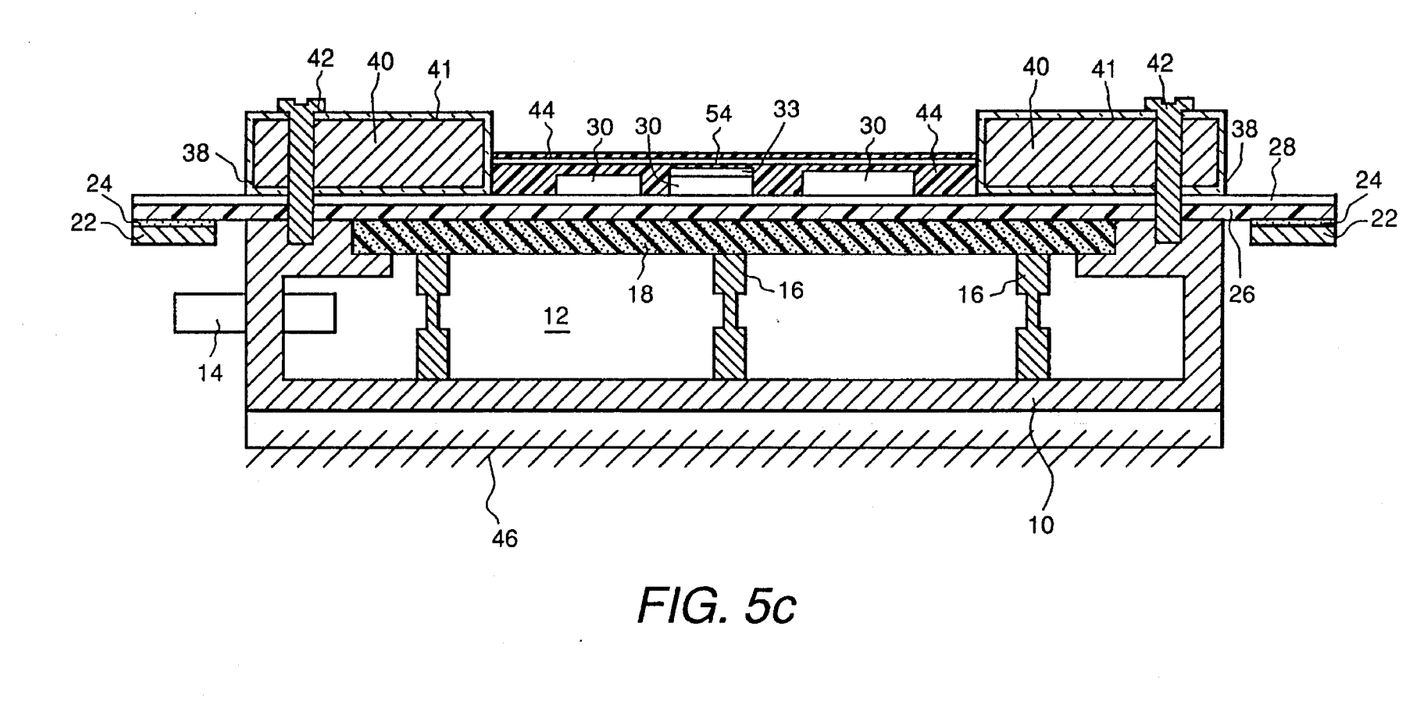
FIG. 5c is a view similar to that of FIG. 5b, showing a reinforcement plate in the molding material.

FIG. 5c is a view similar to that of FIG. 5b, showing a reinforcement plate 54 in molding material 44. Plate 54 is useful for preventing evaporation of the molding material during curing, and thus for reducing warping of the substrate. In a preferred embodiment, plate 54 is the approximate shape of the opening in the mold form and comprises a material having a low coefficient of thermal expansion. Examples of appropriate materials, for example, include tungsten, molybdenum, titanium, ceramics, and aluminum. The preferred range of thickness of plate 54 is 5 mils to 25 mils. The plate can either be positioned in the middle of the substrate molding material or on top of the substrate molding material. If the substrate molding material is strong enough to support the plate, the plate can be positioned flat on the substrate material, as shown in FIG. 5c. In an alternate embodiment, plate support posts (not shown) are attached to the film at the same time as the electronic components, and plate 54 rests on the posts. If the uncured molding material is particularly pliable, the reinforcement plate can have support posts pre-attached. The reinforcement plate can either remain as part of the electronic assembly after fabrication, or be removed.

Figure 6:
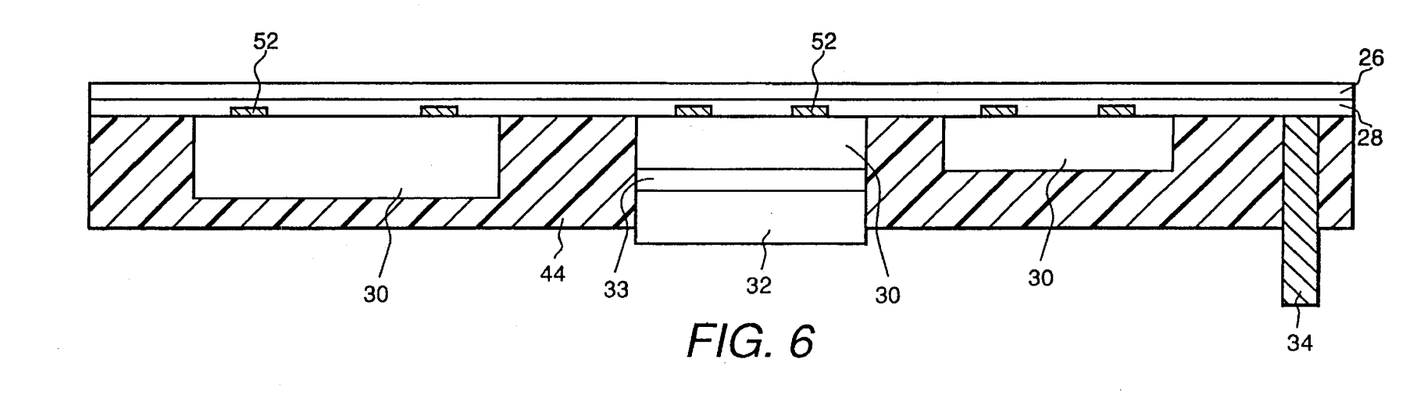
FIG. 6 is an enlarged sectional side view of the molding material and electronic components of FIG. 5 after removal from the vacuum fixture.

FIG. 6 is an enlarged sectional side view of the molding material and electronic components of FIG. 5a after removal from the vacuum fixture. After the molding material is cured and cooled, it is removed from the fixture and cut out of the frame assembly. If desired, the molding material can be machined to remove any meniscus which may have formed at the module edges or at the surface near heat sink 32.

Figure 7:
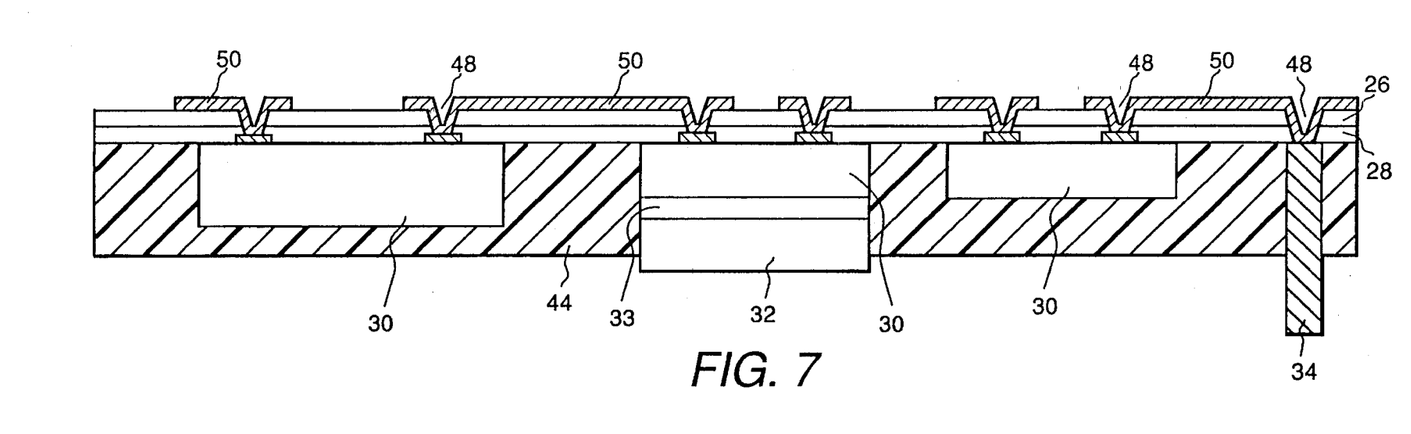
FIG. 7 is a view similar to that of FIG. 6, further showing interconnection of electronic components.

FIG. 7 is a view similar to that of FIG. 6, further showing interconnection of electronic components. In a preferred embodiment, interconnections between the electronic components are made by forming vias 48 to extend through to predetermined component pads 52 and feedthrough pins 34, and a pattern of electrical conductors 50 can then be applied. In one embodiment the pattern of electrical conductors comprises overlapping layers of titanium, copper, and titanium. Additional insulative films and patterns of electrical conductors (not shown) can be added, if desired. Methods of forming and filling via openings 48, methods of patterning electrical conductors 50, and methods of fabricating one or more upper interconnect layers are described in Gorczyca et al., U.S. Pat. No. 5,161,093, issued Nov. 3, 1992, Eichelberger et al., U.S. Pat. No. 4,835,704, issued May 30, 1989, and aforementioned Eichelberger et al., U.S. Pat. No. 4,783,695. Epoxy, polyester, acrylate, and polysulfone materials are generally not Ion Argon UV (350–365 nm) ablatable without chemical doping. Cole et al., U.S. application Ser. No. 07/936,496, filed Aug. 28, 1992, describes a method of doping materials to cause them to be ablatable at desired wavelengths.

Furthermore, electronic components of a substrate of the present invention can be interconnected using techniques other than HDI. For example, methods including TAB (tape automated bonding) and/or wire bonding (not shown) can be used. If the film overlies the substrate and components, that film will either need to be removed or have vias provided therein before interconnecting the components.

Figure 8:
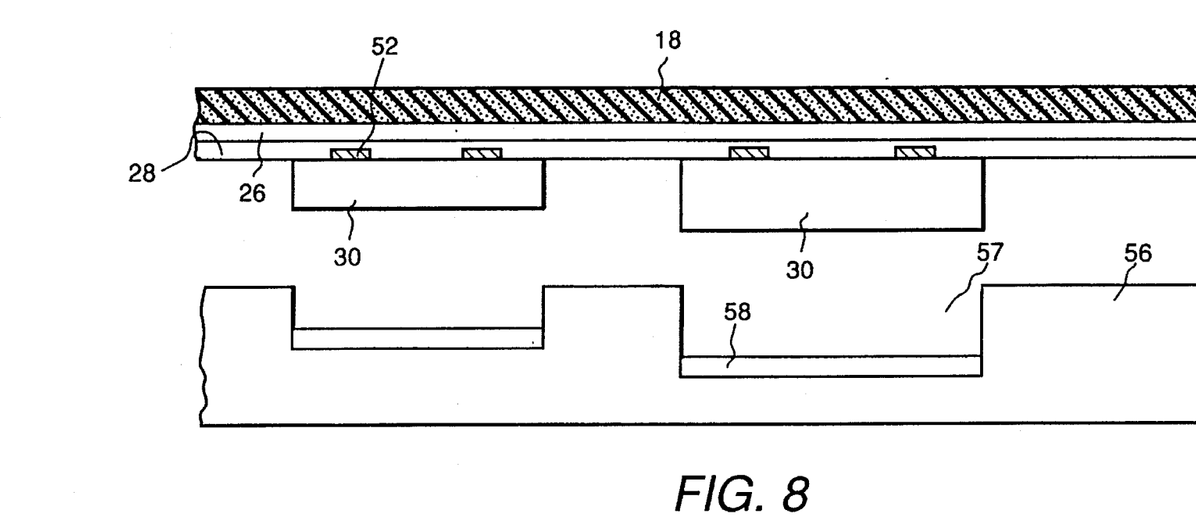
FIG. 8 is a view showing a portion of the film and vacuum fixture of FIG. 3 suspended over a substrate with prefabricated component wells.

FIG. 8 is a view showing a portion of the film 26 and the porous sheet 18 of the vacuum fixture of FIG. 3 suspended over a substrate 56 with prefabricated wells 57. Wells 57 preferably have electronic component adhesive material 58. Adhesive 58 may comprise a silver-filled epoxy such as Ablebond 84-1LMIS, available from Ablestik Labs, Rancho Dominquez, Calif., for example. The substrate may comprise any appropriate structural material, such as for example, a ceramic or a plastic.

Figure 9:
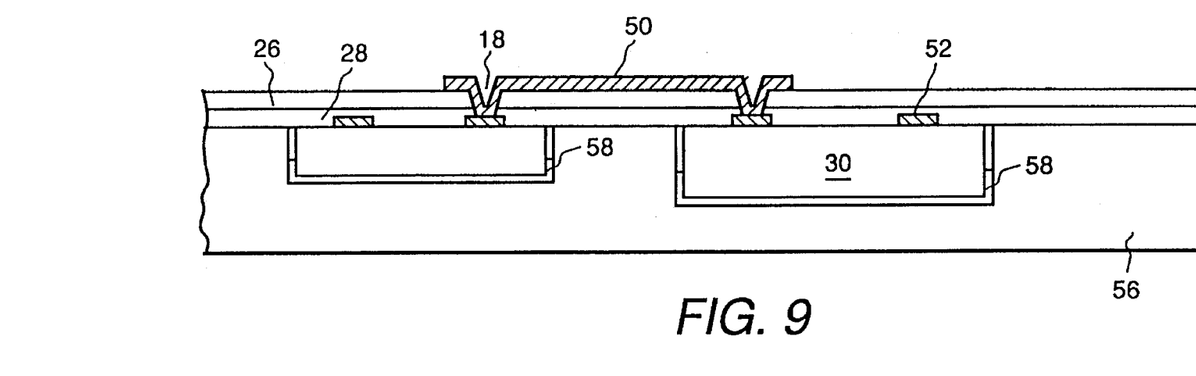
FIG. 9 is a view similar to that of FIG. 8 showing interconnection of electronic components.

FIG. 9 is a view similar to that of FIG. 8 showing the placement of electronic components 30 in wells 57 and interconnection of the electronic components. In this technique electronic components are lowered into the wells while the insulative film is kept planar by vacuum conditions supplied through porous sheet 18. The amount of adhesive 58 that is present in wells 57 prior to component placement is preferably greater than is necessary for component attachment. When the electronic components are lowered in the wells, any excess adhesive is then squeezed upwards between the electronic components and the wells.

The advantage of this technique is that it removes the requirement of precision molding or machining of component wells for achieving a planar film surface. Because of the vacuum conditions, the surface of insulative film 26 is planar when it is attached to the substrate and, especially if the adhesive is hardened under the vacuum conditions, the surface of the film remains planar after the adhesive is hardened. After the electronic components are inserted in the wells, they can be interconnected with pattern of electrical conductors 50 as discussed with respect to FIG. 7.

In a similar embodiment, the electronic components can be positioned in the wells before they are attached to insulative film 26. The insulative film 26 could still be lowered flat over the components and substrate. In a preferred embodiment epoxy 28 would then be cured at about the same time as adhesive 58.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for packaging an electronic component, comprising the steps of:

positioning at least one electronic component having a face with connection pads face down on an insulative film;

positioning the insulative film on a porous sheet supported by a vacuum fixture, the porous sheet and vacuum fixture for creating vacuum conditions for holding the insulative film with a substantially flat surface on the porous sheet;

creating a vacuum for flatly holding the insulative film on the porous sheet; and applying a substrate to the insulative film and the at least one electronic component by securing the insulative film in position with a mold form having at least one opening for holding substrate molding material to be added therein, the at least one opening positioned around the at least one electronic component; and adding substrate molding material at least partially around the at least one component through the at least one opening; and hardening the substrate molding material.

2. The method of claim 1, wherein the step of securing the insulative film includes placing a first portion of the mold form over the vacuum fixture, the first portion comprising a material that is nonadherent to the substrate molding material, and placing a second portion of the mold form over the first portion, the second portion comprising a clamping plate.

3. The method of claim 1, further including the step of providing a coating on at least a portion of the mold form, the coating comprising a material that is nonadherent to the substrate molding material.

4. The method of claim 1, further including the step of positioning a reinforcement plate over at least a portion of the substrate molding material prior to hardening the substrate molding material.

5. The method of claim 1, further including the step of applying an adhesive layer on the insulative film prior to positioning the at least one electronic component.

6. The method of claim 5 wherein the adhesive layer comprises an epoxy.

7. The method of claim 6, wherein the adhesive layer and the substrate molding material comprise similar materials.

8. The method of claim 1, further including the step of applying an adhesive to the face of the at least one electronic component prior to positioning the at least one electronic component.

9. The method of claim 1, further including the steps of, after hardening the substrate molding material, removing the substrate molding material, the insulative film, and the at least one electronic component from the vacuum fixture, forming a plurality of vias in the insulative film aligned with predetermined ones of the component pads, and applying a pattern of electrical conductors extending through selected ones of said vias.

10. A method for packaging an electronic component, comprising the steps of:

positioning at least one electronic component having a face with connection pads face down on an insulative film;

positioning the insulative film on a porous sheet supported by a vacuum fixture, the porous sheet and vacuum fixture for creating vacuum conditions for holding the insulative film with a substantially flat surface on the porous sheet;

creating a vacuum for flatly holding the insulative film on the porous sheet; and applying a substrate to the insulative film and the at least one electronic component by providing a substrate having at least one well therein; and positioning the insulative film on at least a portion of the substrate and the at least one electronic component into the at least one well while maintaining the vacuum.

11. The method of claim 10, further including the step of applying an adhesive to the at least one well prior to positioning the insulative film and the electronic component.

12. A method for packaging an electronic component comprising the steps of:

attaching an insulative film to a frame;

positioning the insulative film on a porous sheet supported by a vacuum fixture, the porous sheet and vacuum fixture for creating vacuum conditions for holding the insulative film with a substantially flat surface on the porous sheet;

providing a substrate having at least one well therein;

positioning at least one electronic component having a face with connection pads face up in the at least one well;

creating a vacuum for flatly holding the insulative film on the porous sheet; and positioning the insulative film on the at least one electronic component and at least a portion of the substrate while maintaining the vacuum.

13. The method of claim 12, further including the step of applying an adhesive to the at least one well prior to positioning the at least one electronic component in the at least one well.

14. An apparatus for fabricating an electronic assembly, the apparatus comprising:

a porous sheet;

a vacuum fixture supporting the porous sheet, the porous sheet and vacuum fixture for creating vacuum conditions for holding an insulative film with a surface substantially flat on the porous sheet; and a mold form positioned over one portion of the vacuum fixture, the mold form having at least one opening for the addition of substrate molding material.

15. The apparatus of claim 14, wherein the mold form comprises a clamping plate and an insert between the vacuum fixture and the clamping plate, the insert comprising a material that is nonadherent to the substrate molding material.

16. The apparatus of claim 15, wherein the insert has a thickness which is greater than the thickness of the substrate molding material.

17. The apparatus of claim 16, wherein the insert comprises polytetrafluoroethylene.

18. The apparatus of claim 14, further including a coating on at least a portion of the mold form, the coating comprising a material that is nonadherent to the substrate molding material.

19. The apparatus of claim 18, wherein the coating comprises polytetrafluoroethylene.

20. The apparatus of claim 14, further including at least one screw extending through the mold form and into the vacuum fixture for securing the mold form in position.

21. The apparatus of claim 14, further including a clamp for securing the mold form in position.

22. The apparatus of claim 14, wherein the porous sheet comprises a material selected from the group consisting of stainless steel, nickel molybdenum metal alloys, nickel copper metal alloys, and nickel chromium metal alloys.

23. The apparatus of claim 22, wherein the vacuum fixture and the support posts comprise a material selected from the group consisting of titanium, stainless steel, and nickel alloys.

* * * * *